(12) United States Patent
Yoon et al.

(10) Patent No.: US 11,038,138 B2
(45) Date of Patent: Jun. 15, 2021

(54) ORGANIC ELECTROLUMINESCENT DEVICE AND METHOD FOR MANUFACTURING THE SAME

(71) Applicant: LG Chem, Ltd., Seoul (KR)

(72) Inventors: Seokhee Yoon, Daejeon (KR); Jaechol Lee, Daejeon (KR); Donggu Lee, Daejeon (KR); Hwakyung Kim, Daejeon (KR); Jaesoon Bae, Daejeon (KR); Jae Hak Jeong, Daejeon (KR); Jiyeon Shin, Daejeon (KR)

(73) Assignee: LG Chem, Ltd.

( * ) Notice: Subject to any disclaimer, the term of this patent is extended or adjusted under 35 U.S.C. 154(b) by 362 days.

(21) Appl. No.: 16/317,721

(22) PCT Filed: Aug. 11, 2017

(86) PCT No.: PCT/KR2017/008760
§ 371 (c)(1),
(2) Date: Jan. 14, 2019

(87) PCT Pub. No.: WO2019/031634
PCT Pub. Date: Feb. 14, 2019

(65) Prior Publication Data
US 2019/0386238 A1    Dec. 19, 2019

(51) Int. Cl.
*H01L 51/50* (2006.01)
*H01L 51/00* (2006.01)
(Continued)

(52) U.S. Cl.
CPC ...... *H01L 51/5092* (2013.01); *H01L 51/0007* (2013.01); *H01L 51/0084* (2013.01);
(Continued)

(58) Field of Classification Search
None
See application file for complete search history.

(56) References Cited

U.S. PATENT DOCUMENTS

2006/0280969 A1    12/2006  Seo et al.
2007/0170843 A1    7/2007   Kawamura et al.
(Continued)

FOREIGN PATENT DOCUMENTS

CN    102017216 A    4/2011
CN    102473847 A    5/2012
(Continued)

OTHER PUBLICATIONS

Search report from International Application No. PCT/KR2017/008760, dated May 10, 2018.
(Continued)

*Primary Examiner* — Gregory D Clark
(74) *Attorney, Agent, or Firm* — Lerner, David, Littenberg, Krumholz & Mentlik, LLP

(57) ABSTRACT

The present specification relates to a hole injection or transfer layer or charge generation layer coating composition of an organic electroluminescent device comprising an organic metal complex comprising at least one of Mo, V, Re, Ni and Pt, and W; and an organic solvent, a method for manufacturing an organic electroluminescent device using the same, and an organic electroluminescent device.

20 Claims, 1 Drawing Sheet

(51) Int. Cl.
*H01L 51/52* (2006.01)
*H01L 51/56* (2006.01)

(52) U.S. Cl.
CPC ...... *H01L 51/5206* (2013.01); *H01L 51/5221* (2013.01); *H01L 51/56* (2013.01); *H01L 51/5056* (2013.01); *H01L 51/5072* (2013.01); *H01L 2251/303* (2013.01)

(56) References Cited

U.S. PATENT DOCUMENTS

| | | |
|---|---|---|
| 2007/0285008 A1 | 12/2007 | Matsuo et al. |
| 2009/0160322 A1* | 6/2009 | Yoshida .............. H01L 27/3283 313/504 |
| 2010/0102310 A1 | 4/2010 | Komatsu et al. |
| 2011/0037065 A1* | 2/2011 | Ueno .................... H01L 51/009 257/40 |
| 2012/0119201 A1 | 5/2012 | Ueno et al. |
| 2012/0132934 A1 | 5/2012 | Ohuchi et al. |
| 2012/0138916 A1 | 6/2012 | Ueno et al. |
| 2012/0205645 A1 | 8/2012 | Fuchs et al. |
| 2013/0101867 A1 | 4/2013 | Yukinobu et al. |
| 2014/0231795 A1 | 8/2014 | Otsuki et al. |
| 2014/0306203 A1 | 10/2014 | Akino et al. |
| 2015/0171350 A1 | 6/2015 | Strassner et al. |
| 2015/0270500 A1 | 9/2015 | Stoessel et al. |
| 2016/0141542 A1 | 5/2016 | Sun et al. |

FOREIGN PATENT DOCUMENTS

| | | |
|---|---|---|
| CN | 102598342 A | 7/2012 |
| CN | 103843165 A | 6/2014 |
| EP | 2772956 A1 | 9/2014 |
| EP | 3471161 A2 | 4/2019 |
| JP | 2009290205 A | 12/2009 |
| JP | 2010103374 A | 5/2010 |
| JP | 2011049547 A | 3/2011 |
| JP | 2011107476 A | 6/2011 |
| JP | 2011134895 A | 7/2011 |
| JP | 5240532 B2 | 7/2013 |
| KR | 20040002897 A | 1/2004 |
| KR | 20060135801 A | 12/2006 |
| KR | 20070053281 A | 5/2007 |
| KR | 20110015525 A | 2/2011 |
| KR | 20120096493 A | 8/2012 |
| KR | 20120112277 A | 10/2012 |
| KR | 20150036640 A | 4/2015 |
| KR | 101525375 B1 | 6/2015 |
| KR | 20150066579 A | 6/2015 |
| KR | 20150113622 A | 10/2015 |
| WO | 2011155635 A1 | 12/2011 |

OTHER PUBLICATIONS

Extended European Search Report including the Written Opinion for Application No. EP 17917215.0 dated Jul. 5, 2019, pp. 1-9.
Chinese Search Report for Application No. 201780048296.6, dated Aug. 4, 2020, pp. 1-2.

\* cited by examiner

【FIG. 1】
| 701 |
|---|
| 601 |
| 501 |
| 401 |
| 301 |
| 201 |
| 101 |
【FIG. 2】
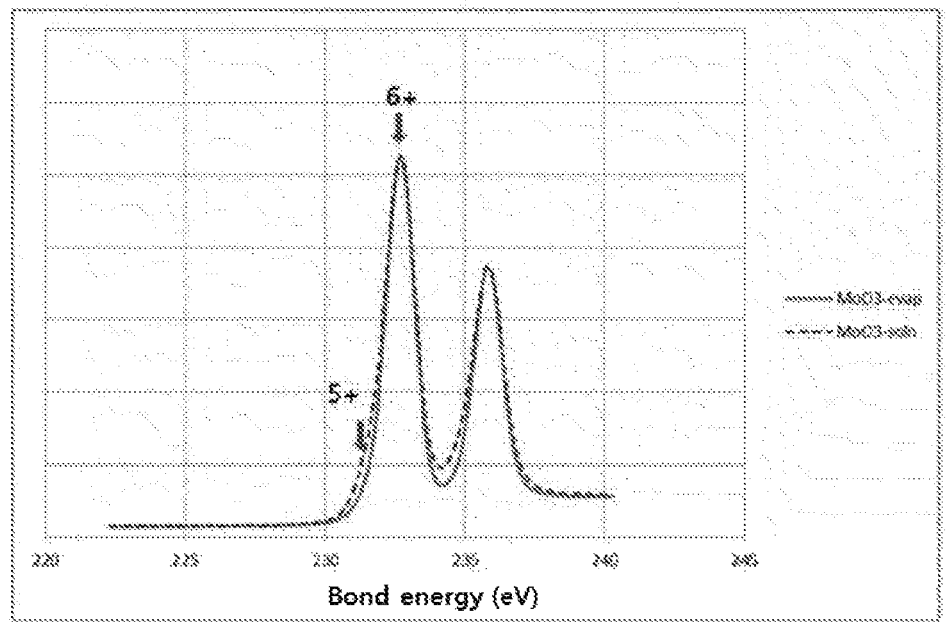

ORGANIC ELECTROLUMINESCENT DEVICE AND METHOD FOR MANUFACTURING THE SAME

CROSS-REFERENCE TO RELATED APPLICATIONS

The present application is a national phase entry under 35 U.S.C. § 371 of International Application No. PCT/KR2017/008760 filed Aug. 11, 2017, which is incorporated herein by reference.

TECHNICAL FIELD

The present specification relates to a method for manufacturing an organic electroluminescent device, and an organic electroluminescent device manufactured using the same.

BACKGROUND ART

An organic light emission phenomenon is one of examples converting current to visible light by an internal process of specific organic molecules. A principle of an organic light emission phenomenon is as follows. When an organic material layer is placed between an anode and a cathode and a current is applied between the two electrodes, electrons and holes are injected to the organic material layer from the cathode and the anode, respectively. The holes and the electrons injected to the organic material layer recombine to form excitons, and light emits when these excitons fall back to the ground state. An organic electroluminescence device using such a principle may be generally formed with a cathode, an anode, and an organic material layer placed therebetween, for example, an organic material layer comprising a hole injection layer, a hole transfer layer, a light emitting layer and an electron transfer layer.

When manufacturing an organic electroluminescence device using a vacuum process, there are disadvantages in that a burden for high equipment investment costs and process costs is very high, uniformly enlarging the device has limits, and utilization of materials is low since, during deposition, the percentage of being wasted without being deposited on a substrate is high. Meanwhile, when manufacturing an organic electroluminescence device using a solution process, there are advantages in that manufacturing costs may be reduced by excluding high-priced deposition equipment, and a large area device is readily manufactured. However, when laminating layers forming an organic electroluminescence device through a solution process, lower layers are likely to be damaged by processes of forming upper layers, unlike in the deposition process. In other words, materials of lower layers are dissolved again by solvents or inks used in the solution process causing a phenomenon of mixing with upper layers or physically damaging a thin film. In order to prevent such a phenomenon, solvents used in each layer are employed not to have solubility for each other, or a process of preventing the dissolution of lower layers when forming upper layers through post-treatment for the lower layers may also be added.

In an organic electroluminescence device manufactured using such a solution process method, a hole injection layer material that is most often used is a conductive polymer. These do not have high solubility themselves, and normally have an aqueous solution form, and therefore, processibility is somewhat guaranteed since the solvent properties are different from organic solvents used in upper layers. In addition, when using these, a relatively low operating voltage is obtained. However, these normally use acidic dopant materials with a low pH and damage electrode materials that are lower layers, and thereby have a disadvantage of declining a life time property. Meanwhile, as another method of forming a hole injection layer, a method of forming by doping an ionic material or an n-type material such as TCNQ to an arylamine-based material is known. However, as described above, this method still has a problem of post process tolerance for solvents or inks.

DISCLOSURE

Technical Problem

The present specification is directed to providing a hole injection or transfer layer or charge generation layer coating composition that may be used when manufacturing an organic electroluminescence device using a solution process, a method for manufacturing an organic electroluminescence device using the same, and an organic electroluminescence device manufactured using the same.

Technical Solution

One embodiment of the present specification provides a hole injection or transfer layer or charge generation layer coating composition of an organic electroluminescent device, the coating composition comprising an organic metal complex comprising at least one of Mo, V, Re, Ni and Pt, and W; and an organic solvent.

Another embodiment of the present specification provides a method for manufacturing an organic electroluminescent device comprising preparing a substrate; forming a first electrode on the substrate; forming one or more organic material layers on the first electrode; and forming a second electrode on the organic material layer, and further comprising forming a hole injection or transfer layer or a charge generation layer between the first electrode and the organic material layer, between the second electrode and the organic material layer, or, when the organic material layer is present in two or more layers, between the organic material layers through a coating method using the coating composition according to the embodiment described above.

Another embodiment of the present specification provides an organic electroluminescent device comprising a first electrode; a second electrode; and one or more organic material layers provided between the first electrode and the second electrode, and further comprising a hole injection or transfer layer or a charge generation layer provided between the first electrode and the organic material layer, between the second electrode and the organic material layer, or, when the organic material layer is present in two or more layers, between the organic material layers, and formed using the coating composition according to the embodiment described above.

Another embodiment of the present specification provides an organic electroluminescent device comprising a first electrode; a second electrode; and one or more organic material layers provided between the first electrode and the second electrode, and further comprising a hole injection or transfer layer or a charge generation layer provided between the first electrode and the organic material layer, between the second electrode and the organic material layer, or, when the organic material layer is present in two or more layers, between the organic material layers, and formed with a metal oxide comprising at least one of Mo, V, Re, Ni and Pt, and W.

Advantageous Effects

In the present specification, by using a coating composition comprising an organic metal complex comprising tungsten (W) and one or more types of other transition metals, and an organic solvent to form a hole injection or transfer layer or a charge generation layer of an organic electroluminescent device, an organic electroluminescent device having no damages on an electrode such as an ITO electrode, having improved interfacial properties, having excellent solvent resistance and thereby having a prolonged device life time can be provided when manufacturing the organic electroluminescent device using a solution process method. Particularly, by using an organic metal complex comprising two or more types of metals described above according to embodiments of the present specification, work function of a layer formed using the same is changed, and as a result, charge injection properties can be diversified.

A hole injection or transfer layer or a charge generation layer obtained from the ink composition for coating is present in a doped metal oxide form finally by a solvent being removed in a drying process after coating, and an organic material ligand of the organic metal complex reacting with oxygen in the air and being decomposed and removed in a heat treatment process, and therefore, an organic light emitting device with a long life time can be obtained. In addition, when the ligand is oxidized while being decomposed during a process of heat treating the film coated with the coating composition, the central metal element reacts with oxygen in the air to form an M-O-M bond to produce $MO_3$ such as $WO_3$ or $MoO_3$, NiO, $Re_2O_7$, $V_2O_5$ form, and as different types of oxides such as $W_2O_5$ or $Mo_2O_5$ are also produced in some parts due to an M-M bond formed by bonding of metal atoms themselves, a doping effect of a metal oxide caused by oxygen deficiency known as general metal oxide doping mechanism can be obtained. Whereas a hole injection layer formed with $MoO_3$, $WO_3$ or the like by vacuum deposition has a rapid driving voltage increase as a thickness thereof increases and the layer almost functions as an insulator particularly at 30 nm or greater, a hole injection or transfer layer or a charge generation layer formed with a metal oxide prepared using the coating composition according to the present specification has increased charge concentration and charge mobility in the whole metal oxide thin film due to the doping effect described above, and as a result, a driving voltage does not increase even when the thickness increases to 30 nm or higher.

In addition, by using an organic solvent as above, a thin film forming property after coating is excellent compared to when using an aqueous solution dissolving a metal oxide powder itself such as $MoO_3$ or $V_2O_5$ by adding $H_2O_2$, $NH_4OH$ or the like, and a mass production process such as inkjet can be used, and device properties can be enhanced by excluding residual moisture. Particularly, according to embodiments of the present specification, inks having proper viscosity and favorable coating properties can be prepared by using the organic metal complex described above even when comprising a substituent such as a halogen group is partially included since, while being dissolved in a ketone-based, an alcohol-based or an ester-based solvent, the substituent is substituted by the solvent, which is advantageous in preparing a hole injection or transfer layer or a charge generation layer through a coating method using the ink.

DESCRIPTION OF DRAWINGS

FIG. 1 is a diagram illustrating an organic electroluminescent device according to one embodiment of the present specification.

FIG. 2 shows XPS results that may identify a Mo—Mo bond when forming a thin film using a coating composition according to one embodiment of the present disclosure.

101: Substrate
201: Anode
301: Hole Injection Layer
401: Hole Transfer Layer
501: Light Emitting Layer
601: Electron Transfer Layer
701: Cathode

MODE FOR DISCLOSURE

Hereinafter, the present specification will be described in detail.

In the present specification, a description of a certain member being placed "on" another member comprises not only a case of the certain member adjoining the another member but a case of still another member being present between the two members.

In the present specification, a description of a certain part "comprising" certain constituents means capable of further comprising other constituents, and does not exclude other constituents unless particularly stated on the contrary.

One embodiment of the present specification provides a hole injection or transfer layer or charge generation layer coating composition of an organic electroluminescent device, the composition comprising an organic metal complex comprising at least one of Mo, V, Re, Ni and Pt, and W; and an organic solvent.

The oxide such as Mo, V, Re or Ni is known as a p-type semiconductor oxide, and an oxide such as Ti or Zr is known as an n-type oxide. These oxides each have different work function. When doping these oxides to tungsten oxide that is a p-type oxide and has large work function, the work function may vary by slightly changing the work function of the tungsten oxide depending on properties of each of these doping materials. Accordingly, by controlling a hole and electron balance in a device through matching depending on the types and characteristics of a hole transfer layer, a light emitting layer and an electron transfer layer located on an upper layer, a long life time and light emission efficiency may be controlled.

The organic metal complex may have one complex comprising at least one of Mo, V, Re, Ni and Pt, and W, and the organic metal complex may comprise an organic metal complex comprising at least one of Mo, V, Re, Ni and Pt and an organic metal complex comprising W.

According to one embodiment, the organic metal complex may comprise an organic metal complex comprising Mo and an organic metal complex comprising W.

According to another embodiment, the organic metal complex may comprise an organic metal complex comprising V and an organic metal complex comprising W.

According to another embodiment, the organic metal complex may comprise an organic metal complex comprising Re and an organic metal complex comprising W.

According to another embodiment, the organic metal complex may comprise an organic metal complex comprising Ni and an organic metal complex comprising W.

According to another embodiment, an atomic ratio of W among the total metal atoms in the coating composition is from at % to 99.9 at % and preferably from 50 at % to 99.9 at %.

In the embodiment, the organic metal complex may be a complex having an oxidation number from −2 to +6. The organic metal complex comprises an organic ligand bonding to the metal described above. The organic ligand is not particularly limited, but may be selected considering solvent solubility or interfacial properties with adjacent organic material layers. Examples of the organic ligand may comprise carbonyl, an acetyl group, acetylacetonate group, a methyl acetoacetate group, an ethyl acetoacetate group, thioacetate, isocyanate, cyanate, isocyanate, a halogen atom and the like. In addition, the organic ligand may have a structure comprising an aromatic ring and/or a heteroring, and examples thereof may comprise benzene, triphenylamine, fluorene, biphenyl, pyrene, anthracene, carbazole, phenylpyridine, trithiophene, phenyloxadiazole, phenyltriazole, benzimidazole, phenyltriazine, benzodiathiazine, phenyl quinoxaline, phenylene vinylene, phenylsilole or combinations of these structures. The aromatic ring or the heteroring may have substituents, and examples of the substituent may comprise an alkyl group, a halogen atom, an alkoxy group, a cyano group, a nitro group and the like. The alkyl group and the alkoxy group may have, for example, 1 to 12 carbon atoms.

Specifically, examples of the organic ligand may comprise alkoxy or acetate-based such as acetylacetonate (acac), ethyl acetoacetate, methyl acetoacetate, OPh, carbonyl, methoxy, ethoxy, propoxy, isopropoxy, butoxy, sec-butoxy, tert-butoxy, pentoxy, hexyloxy, heptyloxy, octyloxy or ethylhexyloxy, but are not limited thereto. In addition, the organic ligand may be a ligand having a form in which these and a halogen group are present together.

The organic metal complex may comprise a metal oxide. The metal oxide may comprise a metal oxide comprising at least one of Mo, V, Re, Ni and Pt, and a metal oxide comprising W, or the metal oxide may comprise a metal oxide comprising at least one of Mo, V, Re, Ni and Pt, and W, and the organic ligand described above may be coordinated to the metal oxide. Examples of the organic metal complex may comprise $W(CO)_6$, $Mo(CO)_6$, $WO_2Cl_2$, $MoO_2(acac)_2$ or $Ni(acac)_2$. When the organic metal complex comprises V as another embodiment, $VO(acac)_2$ partially substituted with oxygen or $V(acac)_3$ that are not substituted may be included. When the organic metal complex comprises W as another embodiment, $W(acac)_3$ or partially oxidized $WO_2(acac)_2$ may be included. In addition, the organic metal complex may have a form of bonding two or more different ligands. For example, the organic metal complex may be molybdenum dichloride dioxide or $ReCl(CO)_5$.

In one embodiment, the organic solvent is an alcohol-based solvent.

In another embodiment, the organic solvent is a ketone-based solvent.

In the present specification, Examples of the organic solvent may comprise acetone, methyl ethyl ketone, diethyl ketone, cyclohexanone, cyclopentanone, isophorone, acetylacetone, tetralone, ethyl benzoate, methyl benzoate, butyl benzoate, ethyl acetate, ethyl acetoacetate, diethyl acetoacetate, methyl benzoate, ethyl benzoate, methanol, ethanol, propanol, isopropanol, butanol, sec-butanol, tert-butanol, pentanol, cyclopentanol, hexanol, cyclohexanol, heptanol and octanol, or may be a solvent represented by the following General Formula 1.

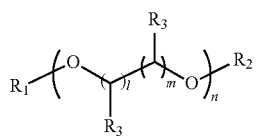

[General Formula 1]

In General Formula 1, n is an integer of 1 to 20, l and m are each or simultaneously an integer from 0 to 5, and $R_1$, $R_2$, $R_3$ and $R_4$ are each or simultaneously a hydrogen atom, an alkyl group having 1 to 20 carbon atoms, an alkenyl group having 2 to 20 carbon atoms, an alkynyl group having 2 to 20 carbon atoms, an alkoxy group having 1 to 20 carbon atoms, an aryl group having 6 to 40 carbon atoms, a heteroaryl group having 2 to 40 carbon atoms or an ester group having 1 to 20 carbon atoms.

According to one embodiment, the organic solvent preferably has a boiling point of 350° C. or lower. Specific examples thereof may comprise ethylene glycol, ethylene glycol monomethyl ether, ethylene glycol monoethyl ether, ethylene glycol monopropyl ether, ethylene glycol monobutyl ether, ethylene glycol monopentyl ether, ethylene glycol monohexyl ether, ethylene glycol dimethyl ether, ethylene glycol diethyl ether, ethylene glycol dipropyl ether, ethylene glycol dibutyl ether, ethylene glycol dipentyl ether, ethylene glycol dihexyl ether, 1,2-propanediol, 1,3-propanediol, 1,4-butanediol, 1,2-butanediol, 1,3-butanediol, diethylene glycol, diethylene glycol monomethyl ether, diethylene glycol monoethyl ether, diethylene glycol monopropyl ether, diethylene glycol monobutyl ether, diethylene dimethyl ether, diethylene glycol diethyl ether, diethylene glycol dipropyl ether, diethylene glycol dibutyl ether, ethylene glycol diacetate, PEG 600, triethylene glycol and the like.

Particularly, the solvent represented by General Formula 1 does not form chemically strong bonds with the organic metal complex used as a metal oxide precursor, but prevents the precursor from readily changing into other oxidation states or materials, and therefore, has an advantage of producing an oxide thin film with no organic materials left after manufacturing a device.

According to one embodiment, the organic metal complex content in the coating composition is preferably from 0.01% by weight to 50% by weight. In the coating composition, additives may be further included in addition to the organic metal complex in order to improve properties such as coating properties and viscosity. For example, the additive may comprise any one or more selected from the group consisting of a dispersant, a surfactant, a polymerizing agent, a binding agent, a crosslinking binding agent, an emulsifier, an antifoaming agent, a drying agent, a filler, an extender, a thickening agent, a film conditioning agent, an anti-oxidant, a free-flowing agent, a leveling additive and a corrosion inhibitor.

Another embodiment of the present specification relates to a method for manufacturing an organic electroluminescent device, and the method comprises preparing a substrate; forming a first electrode on the substrate; forming one or more organic material layers on the first electrode; and forming a second electrode on the organic material layer, and further comprising forming a hole injection or transfer layer or a charge generation layer between the first electrode and the organic material layer, between the second electrode and the organic material layer, or, when the organic material layer is present in two or more layers, between the organic material layers through a coating method using the coating composition according to the embodiment described above.

The coating method forming a hole injection or transfer layer or a charge generation layer may be, for example, any one selected from the group consisting of a spin coating method, an inkjet method, nozzle printing, wet coating, spray coating, doctor blade coating, contact printing, upper feed reverse printing, lower feed reverse printing, nozzle feed reverse printing, gravure printing, microgravure printing, reverse microgravure printing, roll coating, slot die coating, capillary coating, jet deposition and spray deposition, and may be preferably spin coating, inkjet coating, nozzle printing or the like.

The coating may be carried out by coating the composition described above on the first electrode or the second electrode, and drying the result. The drying and heat treatment or heat treatment after drying may be carried out under nitrogen or in the atmosphere, however, carrying out in the atmosphere is advantageous in removing the solvent and the organic material ligand, and is advantageous in converting the organic metal complex to an oxide. In addition, as for the heat treatment, the treatment temperature may vary depending on the organic metal complex used, but may be 150° C. or higher and preferably 200° C. or higher.

According to one embodiment, the hole injection or transfer layer or the charge generation layer formed using the coating composition has a thickness of 1 nm to 1,000 nm. In a general organic electroluminescence device, the whole device thickness needs to be optimized due to a cavity effect, and when optimizing the thickness, the thickness needs to be changed from a few nm to 1 micrometer depending on the upper layer materials. Herein, when capable of varying the charge injection or transfer layer thickness without declining device properties, limits in the upper layer device structure and thickness changes decrease, which is advantageous in providing optimized device properties. The hole injection or transfer layer provided in the present disclosure provides a material and a device with no voltage increases by the thickness.

According to another embodiment, the manufacturing method further comprises annealing after forming the hole injection or transfer layer or the charge generation layer formed using the coating composition. The annealing may be carried out at a temperature of 150° C. to 250° C. In the present disclosure, the annealing aims to remove the organic ligand of the organic metal complex in the annealing process and change to a metal oxide, and therefore, the temperature is preferably a high temperature enough to decompose the ligand of the organic metal complex and the atmosphere is preferably an atmosphere having oxygen in order to change to an oxide.

In the embodiment, except that the hole injection or transfer layer or the charge generation layer is formed using the coating composition according to the embodiment described above, materials and preparation methods of other electrodes and organic material layers may use those known in the art.

According to one embodiment, the first electrode is an anode and the second electrode is a cathode.

According to another embodiment, the second electrode is an anode, and the first electrode is a cathode.

According to one embodiment, the organic material layer comprises a light emitting layer.

According to another embodiment, the organic material layer may be formed in a multilayer structure, and for example, may comprise a light emitting layer and at least one layer of a hole injection layer, a hole transfer layer, an electron transfer layer, an electron injection layer, an electron blocking layer and a hole blocking layer. For example, a structure of an organic electroluminescence device according to one embodiment of the present specification is illustrated in FIG. 1.

FIG. 1 illustrates a structure of an organic electroluminescence device in which an anode (201), a hole injection layer (301), a hole transfer layer (401), a light emitting layer (501), an electron transfer layer (601) and a cathode (701) are consecutively laminated on a substrate (101). In FIG. 1, the hole injection layer (301) may be formed using the coating composition described above. However, FIG. 1 illustrates an organic electroluminescence device, and the organic electroluminescence device is not limited thereto.

When the organic electroluminescence device comprises a plurality of organic material layers, the organic material layers may be formed with materials the same as or different from each other.

For example, the organic electroluminescence device of the present specification may be manufactured by consecutively laminating an anode, an organic material layer and a cathode on a substrate. Herein, the organic electroluminescence device may be manufactured by forming an anode on a substrate by depositing a metal, a metal oxide having conductivity, or an alloy thereof using a physical vapor deposition (PVD) method such as sputtering or e-beam evaporation, forming an organic material layer comprising a hole injection layer, a hole transfer layer, a light emitting layer and an electron transfer layer thereon, and then depositing a material capable of being used as a cathode thereon. In addition to such a method, the organic electroluminescence device may also be manufactured by consecutively depositing a cathode material, an organic material layer and an anode material on a substrate. Herein, at least one layer or all the layers present between the anode and the cathode may be formed using a solution process. Examples of the solution process may comprise a printing method such as inkjet printing, nozzle printing, offset printing, transfer printing or screen printing, but are not limited thereto. Using the solution process is economically effective in terms of time and costs when manufacturing the device. When the organic material layer is formed using the solution process, heat treatment or light treatment may be further carried out as necessary. Herein, the heat treatment temperature and time may be selected depending on the process condition or the materials used, and for example, the heat treatment may be carried out for 1 minute to 1 hour at 85° C. to 300° C.

As the anode material, materials having large work function are normally preferred so that hole injection to an organic material layer is smooth. Specific examples of the anode material capable of being used in the present disclosure comprise metals such as vanadium, chromium, copper, zinc and gold, or alloys thereof; metal oxides such as zinc oxide, indium oxide, indium tin oxide (ITO), indium gallium zinc oxide (IGZO), fluorine-doped tin oxide (FTO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, but are not limited thereto.

As the cathode material, materials having small work function are normally preferred so that electron injection to an organic material layer is smooth. Specific examples of the cathode material comprise metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

When forming an additional hole injection layer in addition to the hole injection or transfer layer formed using the coating composition comprising the organic metal complex described above, the hole injection layer material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in between the work function of an anode material and the HOMO of surrounding organic material layers. Specific examples of the hole injection material comprise metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suitable. Specific examples thereof comprise arylamine-based organic materials, conductive polymers, block copolymers having conjugated parts and non-conjugated parts together, and the like, but are not limited thereto.

The light emitting layer material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof comprise 8-hydroxyquinoline aluminum complexes ($Alq_3$); carbazole-based compounds; dimerized styryl compounds; BAlq; 10-hydroxybenzoquinoline-metal compounds; benzoxazole-benzothiazole- and benzimidazole-based compounds; poly(p-phenylenevinylene) (PPV)-based polymers; spiro compounds; polyfluorene, rubrene, and the like, but are not limited thereto.

The light emitting layer may comprise a host material and a dopant material. The host material comprises fused aromatic ring derivatives, heteroring-containing compounds or the like. Specifically, the fused aromatic ring derivative comprises anthracene derivatives, pyrene derivatives, naphthalene derivatives, pentacene derivatives, phenanthrene compounds, fluoranthene compounds and the like, and the heteroring-containing compound comprises carbazole derivatives, dibenzofuran derivatives, ladder-type furan compounds, pyrimidine derivatives and the like, but the material is not limited thereto.

The dopant material comprises aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group and comprises arylamino group-comprising pyrene, anthracene, chrysene, peryflanthene and the like, and the styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group are substituted or unsubstituted. Specifically, styrylamine, styryldiamine, styryltriamine, styryltetramine or the like is included, but the styrylamine compound is not limited thereto. In addition, the metal complex comprises iridium complexes, platinum complexes or the like, but is not limited thereto.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suitable. Specific examples thereof comprise Al complexes of 8-hydroxyquinoline; complexes comprising $Alq_3$; organic radical compounds; hydroxyflavon-metal complexes, and the like, but are not limited thereto. The electron transfer layer may be used together with any desired cathode material as used in the art. Particularly, examples of the suitable cathode material comprise common materials that have small work function, and in which an aluminum layer or a silver layer follows. Specifically, the cathode material comprises cesium, barium, calcium, ytterbium and samarium, and in each case, an aluminum layer or a silver layer follows.

The electron injection layer is a layer that injects electrons from an electrode, and the electron injection material is preferably a compound that has an ability to transfer electrons, has an electron injection effect from a cathode, has an excellent electron injection effect for a light emitting layer or a light emitting material, prevents excitons generated in the light emitting layer from moving to a hole injection layer, and in addition thereto, has an excellent thin film forming ability. Specific examples thereof comprise fluorenone, anthraquinodimethane, diphenoquinone, thiopyran dioxide, oxazole, oxadiazole, triazole, imidazole, perylene tetracarboxylic acid, fluorenylidene methane, anthrone or the like and derivatives thereof, metal complex compounds, nitrogen-containing 5-membered ring derivatives, and the like, but are not limited thereto.

The metal complex compound comprises 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)berylium, bis (10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, and generally, may be formed under the same condition as the hole injection layer. Specifically, oxadiazole derivatives or triazole derivatives, phenanthroline derivatives, BCP, aluminum complexes and the like are included, but the material is not limited thereto.

Another embodiment of the present specification provides an organic electroluminescence device comprising a first electrode; a second electrode; and one or more organic material layers provided between the first electrode and the second electrode, and further comprising a hole injection or transfer layer or a charge generation layer provided between the first electrode and the organic material layer, between the second electrode and the organic material layer, or, when the organic material layer is present in two or more layers, between the organic material layers, and formed using the coating composition according to the embodiments described above.

The hole injection or transfer layer or the charge generation layer formed using the coating composition is formed with a metal oxide. Herein, the metal oxide comprises at least one of Mo, V, Re, Ni and Pt, and W.

One embodiment provides an organic electroluminescent device comprising a first electrode; a second electrode; and one or more organic material layers provided between the first electrode and the second electrode, and further comprising a hole injection or transfer layer or a charge generation layer provided between the first electrode and the organic material layer, between the second electrode and the organic material layer, or, when the organic material layer is present in two or more layers, between the organic material layers, and formed with a metal oxide comprising at least one of Mo, V, Re, Ni and Pt, and W.

According to one embodiment, the hole injection or transfer layer or the charge generation layer formed using the coating composition has a thickness of 1 nm to 1,000 nm. Herein, in the hole injection or transfer layer or the charge generation layer, charge concentration and mobility increase due to a doping effect, and a voltage increase caused by a thickness increase does not occur. When using $WO_3$, $MoO_3$ or the like as a hole injection layer by forming a film through vacuum deposition, an almost insulating property is generally obtained at a thickness of 30 nm or greater, and a driving voltage is known to greatly increase when manufacturing an organic electroluminescent device, however, when preparing a $WO_3$ thin film or a doped $WO_3$ thin film using the coating composition according to the present disclosure, a driving voltage similar to when a thickness is 10 nm is obtained even when a thickness is 40 nm as shown in Example 2 and Example 9 to be described later, and a voltage increase caused by a thickness increase is not exhibited, and this provides advantages in that a device may be manufactured without restrictions on the thickness when optimizing the device. For example, in the above-mentioned thickness range, the voltage increase may be 30% or less and more preferably 20% of less.

According to another embodiment, the hole injection or transfer layer or the charge generation layer formed using the coating composition is annealed. For example, the hole injection or transfer layer or the charge generation layer is annealed at a temperature of 150° C. to 250° C.

According to another embodiment of the present application, the hole injection or transfer layer or the charge generation layer is formed with $W_xM_yO_z$, and herein, M is Mo, V, Re, Ni or Pt, $0<x+y\leq100$, $0<z\leq400$, $50\leq x\leq99.99$ and $0.01\leq y\leq50$.

According to another embodiment of the present application, the hole injection or transfer layer or the charge generation layer comprises an M-O bond and an M-M bond, or comprises $MO_3$ and $M_2O_5$, or forms an M-O—X bond with an interface of an adjoining electrode among the first electrode and the second electrode, and herein, M is Mo, V, Re, Ni, Pt or W, and X is one of elements forming the adjoining electrode among the first electrode and the second electrode. For example, in $MoO_3$, an oxidation number of +5 is obtained in addition to an oxidation number of +6 when forming an Mo—Mo bond by a solution process, and as shown in FIG. 2, it is identified that Mo peaks of +5 oxidation number, a lower oxidation number, are detected when analyzing the thin film obtained through the solution process using XPS. Herein, the amount of Mo having an oxidation number of +5 is not particularly limited as long as it is greater than 0. As another embodiment, the hole injection or transfer layer or the charge generation layer adjoins the first electrode formed with ITO, and forms a W—O—In or W—O—Sn bond at an interface with the first electrode.

For example, adhesive strength is enhanced when forming an M-O—X bond as above between the electrode and the hole injection layer thin film, and mechanical strength of the hole injection layer itself may increase.

According to another embodiment, the hole injection or transfer layer or the charge generation layer has an organic material content of 10 wt % or less. For example, when IR analyzing a thin film obtained by dissolving $MoO_2(acac)_2$ in ethylene glycol monomethyl ether, coating and then heat treating, neither peaks by a carbonyl group of $MoO_2(acac)_2$ nor $CH_2$ stretching peaks of the solvent are observed.

As for other constitutions of the organic electroluminescence device, the descriptions provided above and constitutions known in the art may be applied.

The organic electroluminescence device according to the present specification may be a top-emission type, a bottom-emission type or a dual-emission type depending on the materials used.

Hereinafter, the present specification will be described in detail with reference to examples in order to specifically describe the present specification. However, the examples according to the present specification may be modified to various different forms, and the scope of the present specification is not to be construed as being limited to the examples described below. Examples of the present specification are provided in order to more fully describe the present specification to those having average knowledge in the art.

Example 1

After washing an ITO-coated glass substrate consecutively with water and isopropanol, a solution dissolving 50:50 (weight ratio) of $WO_2(acac)_2$ and $MoO_2(acac)_2$ in ethylene glycol monomethyl ether in 4 wt % was spin coated on the ITO-deposited base for 30 seconds at 2000 rpm. The obtained thin film was heat treated for 15 minutes at 200° C. under oxygen atmosphere to form a very uniform hole injection layer having a thickness of nm.

On the top of the hole injection layer, a hole transfer layer having a thickness of 650 Å was formed using 4,4'-bis[N-(1-naphthyl)-N-phenylamino]biphenyl (NPB).

On the top of the hole transfer layer, an electron blocking layer was formed to a thickness of 150 Å. On the electron blocking layer, a light emitting layer having a thickness of 300 Å was formed by doping BD, a blue dopant, to BH, a blue fluorescent host of the following chemical formula, in a weight ratio of 95:5.

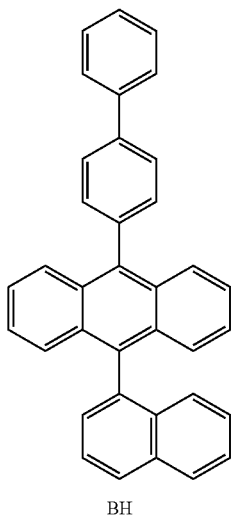

BH

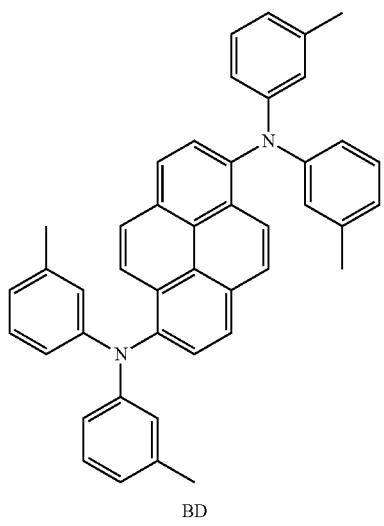

BD

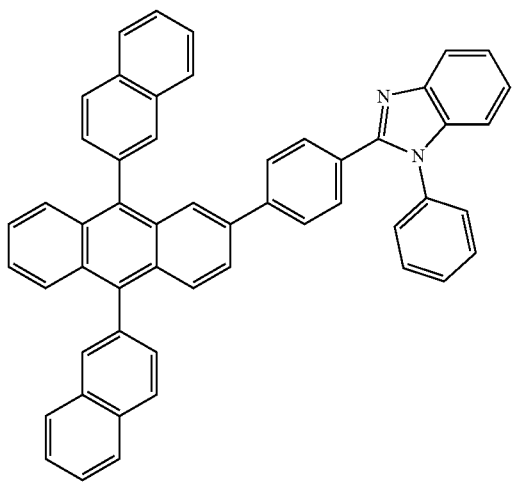

ET 201

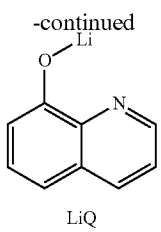

LiQ

Subsequently, on the top of the light emitting layer, an electron transfer layer having a thickness of 200 Å was formed by simultaneously depositing ET 201 and LIQ, electron transfer materials, in a weight ratio of 1:1.

Finally, Al was deposited on the electron transfer layer to a thickness of 800 Å to manufacture an organic electroluminescence device. Properties of this device are shown in Table 1.

Example 2

A device was manufactured in the same manner as in Example 1 except that the hole injection layer was prepared by dissolving 7:3 (weight ratio) of $WO_2(acac)_2$ and $MoO_2(acac)_2$ in cyclohexanone in a 4 wt % concentration, coating the result on the ITO-deposited base at 700 rpm, and heat treating the result under oxygen atmosphere. Herein, the thickness of the hole injection layer was 40 nm.

Example 3

A device was manufactured in the same manner as in Example 1 except that the hole injection layer was prepared by mixing $WO_2(acac)_2$ and $VO(acac)_2$ in a weight ratio of 9:1 and dissolving the result in cyclohexanone in a 2 wt % concentration, coating the result on the ITO-deposited base at 2000 rpm, and heat treating the result under oxygen atmosphere.

Example 4

A device was manufactured in the same manner as in Example 1 except that the hole injection layer was prepared by mixing $WO_2(acac)_2$ and $V(acac)_3$ in a weight ratio of 9:1 and dissolving the result in a solvent mixing ethylene glycol monomethyl ether and cyclohexanol (a weight ratio of 8:2) in a 4 wt % weight ratio, coating the result on the ITO-deposited base, and heat treating the result under oxygen atmosphere.

Example 5

A device was manufactured in the same manner as in Example 1 except that the hole injection layer was prepared by mixing $WO_2(acac)_2$ and $ReCl(CO)_5$ in a weight ratio of 95:5 and dissolving the result in ethylene glycol in a 3 wt % concentration, coating the result on the ITO-deposited base, and heat treating the result under oxygen atmosphere.

Example 6

A device was manufactured in the same manner as in Example 1 except that the hole injection layer was prepared by mixing $W(CO)_6$ and $Mo(CO)_6$ in a weight ratio of 9:1 and dissolving the result in cyclohexanone in a 1 wt % concentration, coating the result on the ITO-deposited base, and heat treating the result under oxygen atmosphere.

Example 7

A device was manufactured in the same manner as in Example 1 except that the hole injection layer was prepared by mixing $WO_2Cl_2$ and $MoO_2(acac)_2$ in a weight ratio of 7:3 and dissolving the result in ethyl benzoate in a 2 wt % concentration, coating the result on the ITO-deposited base, and heat treating the result under oxygen atmosphere.

Example 8

A device was manufactured in the same manner as in Example 1 except that the hole injection layer was prepared by mixing $W(CO)_6$ and $Ni(acac)_2$ in a weight ratio of 9:1 and dissolving the result in ethylene glycol in a 2 wt % concentration, coating the result on the ITO-deposited base, and heat treating the result under oxygen atmosphere.

Example 9

A device was manufactured in the same manner as in Example 1 except that the hole injection layer was prepared by dissolving 7:3 (weight ratio) of $WO_2(acac)_2$ and $MoO_2(acac)_2$ in ethylene glycol monomethyl ether in a 6 wt % concentration, coating the result on the ITO-deposited base at 2000 rpm, and heat treating the result under oxygen atmosphere. Herein, the thickness of the hole injection layer was 10 nm.

Comparative Example 1

A device was manufactured in the same manner as in Example 1 except that the hole transfer layer was formed by depositing NPB on the ITO without the hole injection layer.

Voltage, efficiency and life time (LT80) properties of the devices manufactured in the examples and the comparative example described above were measured under a condition of 10 m/cm², and the measurement results are shown in the following Table 1.

TABLE 1

|  | W Complex | Mixed Complex | Solvent | Voltage | Efficiency (EQE) | LT80 |
| --- | --- | --- | --- | --- | --- | --- |
| Example 1 | $WO_2(acac)_2$ | $MoO_2(acac)_2$ | Ethylene Glycol Monoethyl Ether | 4.73 | 4.97 | 45 |
| Example 2 | $WO_2(acac)_2$ | $MoO_2(acac)_2$ | Cyclohexanone | 5.06 | 5.09 | 31 |
| Example 3 | $WO_2(acac)_2$ | $VO(acac)_2$ | Cyclohexanone | 4.66 | 4.89 | 27 |
| Example 4 | $WO_2(acac)_2$ | $V(acac)_3$ | Ethylene Glycol Monomethyl Ether + Cyclohexanol | 4.56 | 5.05 | 33 |
| Example 5 | $WO_2(acac)_2$ | $Re(CO)_5Cl$ | Ethylene Glycol | 4.46 | 5.06 | 17 |
| Example 6 | $W(CO)_6$ | $Mo(CO)_6$ | Cyclohexanone | 4.54 | 5.17 | 21 |
| Example 7 | $WO_2Cl_2$ | $MoO_2(acac)_2$ | Ethyl Benzoate | 4.45 | 5.25 | 18 |
| Example 8 | $W(CO)_6$ | $Ni(acac)_2$ | Ethylene Glycol | 4.38 | 5.03 | 20 |
| Example 9 | $WO_2(acac)_2$ | $MoO_2(acac)_2$ | Ethylene Glycol Monoethyl Ether | 4.70 | 4.85 | 39 |
| Comparative Example 1 | w/o HIL |  |  | >20 V | X | X |

As shown in Table 1, a driving voltage generally decreased when mixing Mo, V, Ni or Re mostly known as a p-type semiconductor, whereas a driving voltage increased when doping Ti known as an n-type semiconductor. Such results may be construed as work function being changed by doping these metal oxides to W.

The invention claimed is:
1. A hole injection or transfer layer or charge generation layer coating composition of an organic electroluminescent device, the coating composition comprising:
   an organic metal complex comprising at least one of Mo, V, Re, Ni or Pt, and W; and
   an organic solvent.
2. The hole injection or transfer layer or charge generation layer coating composition of an organic electroluminescence device of claim 1, wherein the organic metal complex comprises an organic metal complex comprising at least one of Mo, V, Re, Ni or Pt, and an organic metal complex comprising W.
3. The hole injection or transfer layer or charge generation layer coating composition of an organic electroluminescence device of claim 1, wherein an atomic ratio of W among the total metal atoms in the coating composition is from 10 at % to 99.9 at %.
4. The hole injection or transfer layer or charge generation layer coating composition of an organic electroluminescence device of claim 1, wherein the organic solvent is an alcohol-based solvent.
5. The hole injection or transfer layer or charge generation layer coating composition of an organic electroluminescence device of claim 1, wherein the organic solvent is a ketone-based solvent.
6. The hole injection or transfer layer or charge generation layer coating composition of an organic electroluminescence device of claim 1, wherein the organic solvent comprises a solvent represented by the following General Formula 1:

[General Formula 1]

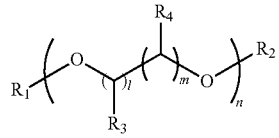

in General Formula 1, n is an integer of 1 to 20, l and m are each independently an integer from 0 to 5, and $R_1$, $R_2$, $R_3$ and $R_4$ are each independently a hydrogen atom, an alkyl group having 1 to 20 carbon atoms, an alkenyl group having 2 to 20 carbon atoms, an alkynyl group having 2 to 20 carbon atoms, an alkoxy group having 1 to 20 carbon atoms, an aryl group having 6 to 40 carbon atoms, a heteroaryl group having 2 to 40 carbon atoms or an ester group having 1 to 20 carbon atoms.

7. The hole injection or transfer layer or charge generation layer coating composition of an organic electroluminescence device of claim 6, wherein the organic solvent comprises at least one of ethylene glycol, ethylene glycol monomethyl ether, ethylene glycol monoethyl ether, ethylene glycol monopropyl ether, ethylene glycol monobutyl ether, ethylene glycol monopentyl ether, ethylene glycol monohexyl ether, ethylene glycol dimethyl ether, ethylene glycol diethyl ether, ethylene glycol dipropyl ether, ethylene glycol dibutyl ether, ethylene glycol dipentyl ether, ethylene glycol dihexyl ether, 1,2-propanediol, 1,3-propanediol, 1,4-butanediol, 1,2-butanediol, 1,3-butanediol, diethylene glycol, diethylene glycol monomethyl ether, diethylene glycol monoethyl ether, diethylene glycol monopropyl ether, diethylene glycol monobutyl ether, diethylene dimethyl ether, diethylene glycol diethyl ether, diethylene glycol dipropyl ether, diethylene glycol dibutyl ether, ethylene glycol diacetate, PEG 600 or triethylene glycol.

8. A method for manufacturing an organic electroluminescent device comprising:
preparing a substrate;
forming a first electrode on the substrate;
forming at least one organic material layer on the first electrode; and
forming a second electrode on the organic material layer, and further comprising forming a hole injection or transfer layer or a charge generation layer between the first electrode and the organic material layer, between the second electrode and the organic material layer, or, when two or more organic material layers are present, between the organic material layers through a coating method using the coating composition of claim 1.

9. The method for manufacturing an organic electroluminescence device of claim 8, wherein the hole injection or transfer layer or the charge generation layer formed using the coating composition has a thickness of 1 nm to 1,000 nm.

10. The method for manufacturing an organic electroluminescence device of claim 8, further comprising annealing after the forming of a hole injection or transfer layer or a charge generation layer formed using the coating composition.

11. The method for manufacturing an organic electroluminescence device of claim 10, wherein the annealing is carried out at a temperature of 150° C. to 250° C.

12. An organic electroluminescence device comprising:
a first electrode;
a second electrode; and
at least one organic material layers provided between the first electrode and the second electrode,
and further comprising a hole injection or transfer layer or a charge generation layer provided between the first electrode and the organic material layer, between the second electrode and the organic material layer, or, when two or more organic material layers are present, between the organic material layers, and formed using the coating composition of claim 1.

13. An organic electroluminescence device comprising:
a first electrode;
a second electrode; and
at least one organic material layers provided between the first electrode and the second electrode,
and further comprising a hole injection or transfer layer or a charge generation layer provided between the first electrode and the organic material layer, between the second electrode and the organic material layer, or, when two or more organic material layers are present, between the organic material layers, and formed with a metal oxide comprising at least one of Mo, V, Re, Ni or Pt, and W.

14. The organic electroluminescence device of claim 12, wherein the hole injection or transfer layer or the charge generation layer has a thickness of 1 nm to 1,000 nm.

15. The organic electroluminescence device of claim 12, wherein the hole injection or transfer layer or the charge generation layer is annealed.

16. The organic electroluminescence device of claim 12, wherein the hole injection or transfer layer or the charge generation layer is annealed at a temperature of 150° C. to 250° C.

17. The organic electroluminescence device of claim 12, wherein the hole injection or transfer layer or the charge generation layer formed using the coating composition is formed with a metal oxide comprising at least one of Mo, V, Re, Ni or Pt, and W.

18. The organic electroluminescence device of claim 12, wherein an atomic ratio of W among the total metal atoms in the hole injection or transfer layer or the charge generation layer is from 10 at % to 99.9 at %.

19. The organic electroluminescence device of claim 12, wherein the hole injection or transfer layer or the charge generation layer is formed with $W_xM_yO_z$, wherein M is Mo, V, Re, Ni or Pt, $0<x+y\leq100$, $0<z\leq400$, $50\leq x\leq99.99$ and $0.01\leq y\leq50$.

20. The organic electroluminescence device of claim 12, wherein the hole injection or transfer layer or the charge generation layer comprises an M-O bond and an M-M bond, or comprises $MO_3$ and $M_2O_5$, or forms an M-O—X bond with an interface of an adjoining electrode among the first electrode and the second electrode, wherein M is Mo, V, Re, Ni, Pt or W, and X is one of elements forming the adjoining electrode among the first electrode and the second electrode.

* * * * *